United States Patent
Kwon et al.

(10) Patent No.: US 9,824,759 B2
(45) Date of Patent: Nov. 21, 2017

(54) NON-VOLATILE MEMORY DEVICES, MEMORY SYSTEMS, AND METHODS OF OPERATING THE SAME

(71) Applicants: Dae-woong Kwon, Seoul (KR);
Jai-hyuk Song, Seongnam-si (KR);
Chang-sub Lee, Osan-si (KR)

(72) Inventors: Dae-woong Kwon, Seoul (KR);
Jai-hyuk Song, Seongnam-si (KR);
Chang-sub Lee, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 14/609,072

(22) Filed: Jan. 29, 2015

(65) Prior Publication Data

US 2015/0228345 A1    Aug. 13, 2015

(30) Foreign Application Priority Data

Feb. 12, 2014   (KR) ......................... 10-2014-0016287

(51) Int. Cl.
*G11C 16/10* (2006.01)
*G11C 16/04* (2006.01)

(52) U.S. Cl.
CPC .......... *G11C 16/10* (2013.01); *G11C 16/0483* (2013.01)

(58) Field of Classification Search
CPC ........................ G11C 16/10; G11C 16/0483
See application file for complete search history.

(56) References Cited

U.S. PATENT DOCUMENTS

| | | | |
|---|---|---|---|
| 6,614,688 B2 * | 9/2003 | Jeong ..................... | G11C 16/10 365/185.05 |
| 6,975,537 B2 * | 12/2005 | Lutze ................. | G11C 16/3418 365/185.17 |
| 7,218,552 B1 * | 5/2007 | Wan ..................... | G11C 11/5628 365/185.14 |
| 7,355,888 B2 | 4/2008 | Hemink et al. | |
| 7,463,522 B2 * | 12/2008 | Dong ....................... | G11C 8/08 365/185.02 |
| 8,027,208 B2 | 9/2011 | Kim | |
| 8,036,028 B2 | 10/2011 | Kim | |
| 8,238,153 B2 * | 8/2012 | Lee ..................... | G11C 16/0483 365/185.02 |
| 8,279,671 B2 * | 10/2012 | Kim ................... | G11C 16/0483 365/185.05 |
| 8,520,438 B2 | 8/2013 | Seo et al. | |
| 8,537,617 B2 | 9/2013 | Kim et al. | |
| 9,368,222 B2 * | 6/2016 | Dunga ................... | G11C 16/24 |
| 2003/0107913 A1 * | 6/2003 | Nii ....................... | G11C 11/4125 365/154 |

(Continued)

FOREIGN PATENT DOCUMENTS

KR    10-0967006    6/2010
KR    1020110001100 A    1/2011

*Primary Examiner* — Douglas King
(74) *Attorney, Agent, or Firm* — Myers Bigel, P.A.

(57) ABSTRACT

In a method of programming a non-volatile memory device, a first voltage is applied to a selected memory cell for programming, and a second voltage is applied to a non-selected memory cell. Before the second voltage rises to a predetermined voltage level, which is less than a program voltage level, the first voltage is greater than the second voltage or the second voltage is maintained at greater than a ground voltage level. Related non-volatile memory devices and memory systems are also discussed.

18 Claims, 20 Drawing Sheets

(56) References Cited

U.S. PATENT DOCUMENTS

| | | | |
|---|---|---|---|
| 2005/0226055 A1* | 10/2005 | Guterman | G11C 16/12 365/185.28 |
| 2010/0002519 A1 | 1/2010 | Kim | |
| 2012/0300527 A1 | 11/2012 | Shim et al. | |
| 2013/0163345 A1 | 6/2013 | Ahn et al. | |
| 2015/0103592 A1* | 4/2015 | Miwa | G11C 16/0483 365/185.02 |

* cited by examiner

NON-VOLATILE MEMORY DEVICES, MEMORY SYSTEMS, AND METHODS OF OPERATING THE SAME

CROSS-REFERENCE TO RELATED APPLICATIONS

This application claims priority under 35 U.S.C. §119 from Korean Patent Application No. 10-2014-0016287, filed on Feb. 12, 2014, in the Korean Intellectual Property Office, the disclosure of which is incorporated herein in its entirety by reference.

BACKGROUND

The inventive concepts relate to non-volatile memory devices, and more particularly, to non-volatile memory devices having increased distribution characteristics, memory systems, and operating methods of the non-volatile memory devices.

A non-volatile memory device, such as a semiconductor memory device, typically includes a plurality of memory cells that store data in a non-volatile manner. A flash memory device, as one example of a non-volatile memory device, may be used in mobile phones, digital cameras, portable digital assistants (PDAs), mobile computer devices, non-mobile or stationary computer devices, and/or other devices.

Due to its structure, a flash memory device may be susceptible to disturbances that may occur therein during memory operations, such as programming operations. For example, disturbances due to hot carrier injection (HCI), etc., may result in changes in the distribution of threshold voltages of the memory cells, and thus, characteristics of memory operations may deteriorate.

SUMMARY

The inventive concepts provide a non-volatile memory device, a memory system, and an operating method of the non-volatile memory device, via which a distribution characteristic of threshold voltages during a memory operation may be improved.

According to some aspects of the inventive concepts, there is provided an operating method of a non-volatile memory device, the operating method including operations of applying a first voltage to a first word line connected with a first cell to be programmed; applying a second voltage to a second word line connected with a second cell not to be programmed; increasing the first voltage to a first level; increasing the second voltage after the first voltage rises to the first level; and increasing the first voltage to a program voltage level that corresponds to a second level.

The non-volatile memory device may include a memory cell array having three-dimensional (3D) NAND (VNAND) memory cells.

After the second voltage rises to the first level, the first voltage may rise to the program voltage level that corresponds to the second level.

The first cell and the second cell may be connected between a bit line and a ground selection line, and the first cell may be adjacent to the bit line, and the second cell may be adjacent to the ground selection line.

The operating method may further include an operation of applying the first voltage to a third word line that is connected with a third cell not to be programmed.

The third cell may be between the first cell and the bit line.

Before the operation of increasing the first voltage to the first level, the operating method may further include an operation of maintaining the first voltage at a third level having a value between a ground voltage and the first level.

The operating method may further include an operation of transiting the first voltage from the third level to a ground voltage level, and the first voltage may rise from the ground voltage level to the first level.

The operating method may further include an operation of maintaining the second voltage at a third level having a value between a ground voltage level and the first level, and after the first voltage rises to the first level, the second voltage may rise from the third level to the first level.

The second voltage may rise after the first cell is turned on, whereby a variation of a threshold voltage of the first cell due to hot carrier injection (HCI) may be decreased.

According to other aspects of the inventive concepts, there is provided a non-volatile memory device including a first cell connected with a first word line; one or more second cells that are adjacent to a ground selection line and the first cell and connected with a second word line; and a voltage generating unit configured to provide first and second voltages to the first and second word lines, respectively, wherein, when the first cell is programmed, rising times of the first voltage and the second voltage are controlled, or a level of at least one of the first voltage and the second voltage is maintained at a second level having a value between a ground voltage and a first level, whereby a variation of a threshold voltage of the first cell due to hot carrier injection (HCI) is decreased.

According to still other aspects of the inventive concepts, in a method of operating a non-volatile memory device, a first voltage and a second voltage are applied to a selected memory cell for programming and a non-selected memory cell, respectively, in a programming operation. Before the second voltage rises to a predetermined voltage level, which is less than a program voltage level, the first voltage is greater than the second voltage or the second voltage is maintained at greater than a ground voltage level.

In some embodiments, the predetermined voltage level may be sufficient to turn on the non-selected memory cell, and the non-selected memory cell may be coupled between the selected memory cell and a ground selection transistor.

In some embodiments, the first voltage may rise to the predetermined voltage level before the second voltage rises to the predetermined voltage level.

In some embodiments, the first voltage may be maintained at an intermediate voltage level, which is less than the predetermined voltage level, before the second voltage rises to the predetermined voltage level. The intermediate voltage level may be sufficient to turn on the selected memory cell.

In some embodiments, before the second voltage rises to the predetermined voltage level, the second voltage may be maintained at an intermediate voltage level less than the predetermined voltage level such that a rise time for the second voltage may define a step function.

In some embodiments, the intermediate voltage level may be greater than the ground voltage level, but may be insufficient to turn on the non-selected memory cell.

In some embodiments, a third voltage may be applied to another non-selected memory cell that is coupled between the selected memory cell and a bit line. The third voltage may rise to the predetermined voltage level before or after the first voltage and/or the second voltage rises to the predetermined voltage level.

In some embodiments, after the second voltage rises to the predetermined voltage level, the first voltage may rise to the program voltage level.

In some embodiments, the first voltage may rise to the predetermined voltage level after the second voltage rises to the predetermined voltage level.

In some embodiments, after the second voltage rises to the predetermined voltage level and before the first voltage rises to the predetermined voltage level, the first voltage may be decreased to the ground voltage level.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
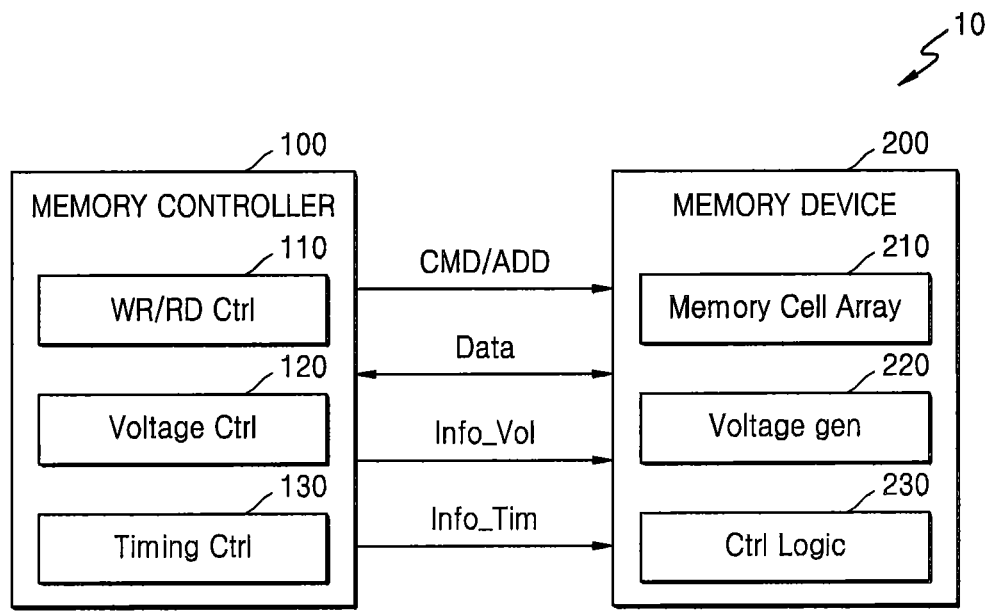
FIG. 1 is a block diagram of a memory system according to some embodiments of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram of a memory system 10 according to some embodiments of the inventive concepts. Referring to FIG. 1, the memory system 10 may include a memory controller 100 and a memory device 200. The memory controller 100 performs a control operation on the memory device 200. For example, the memory controller 100 may provide an address ADD and a command CMD to the memory device 200, and thus may control program (or write), read, and erase operations with respect to the memory device 200. Also, data Data for the program operation and read data Data may be exchanged between the memory controller 100 and the memory device 200.

The memory device 200 may include a memory cell array 210, a voltage generating unit 220, and a control logic 230. The memory cell array 210 may include a plurality of memory cells that are disposed in areas where a plurality of word lines and a plurality of bit lines cross. The memory cell array 210 may include a plurality of non-volatile memory cells that store data in a non-volatile manner. For example, the memory cell array 210 may include, as the non-volatile memory cells, flash memory cells such as a NAND flash memory cell array, a NOR flash memory cell array, etc. Hereinafter, one or more embodiments of the inventive concepts are described in detail under the assumption that the memory cell array 210 includes a flash memory cell array, so that the memory device 200 is a non-volatile memory device. However, it will be understood that the present inventive concepts are not limited to flash memory devices.

The memory controller 100 may include a write/read control unit 110, a voltage control unit 120, and a timing control unit 130. The write/read control unit 110 may generate the address ADD and the command CMD for performing the program (or write), read, and erase operations on the memory cell array 210. Also, the voltage control unit 120 may generate voltage control information Info_vol for controlling at least one voltage level used in the memory device 200. For example, the voltage control unit 120 may generate voltage control information Info_vol for controlling a voltage level of a word line for reading data from the memory cell array 210 or programming data to the memory cell array 210.

The timing control unit 130 may provide timing control information Info_Tim to the memory device 200. The timing control information Info_Tim may be used in controlling a timing of generating various voltages in the memory device 200 or controlling a timing of providing the various generated voltages in the memory device 200. For example, the memory device 200 may generate various word line voltages, based on the timing control information Info_Tim, or may control a timing of providing the word line voltages to word lines via a row decoder, based on the timing control information Info_Tim.

As described above, the memory device 200 may include the memory cell array 210, the voltage generating unit 220, and the control logic 230. The memory cell array 210 may include the non-volatile memory cells, e.g., may include flash memory cells. The flash memory cells may be variously embodied, and for example, the memory cell array 210 may include three-dimensional (3D) (or vertical) NAND (VNAND) memory cells.

An embodiment of the memory cell array 210 will now be described with reference to FIGS. 3 through 6. The memory cell array 210 may include a plurality of memory blocks, and in the embodiment of FIG. 3, a memory block (e.g., a first memory block BLK1) among the plurality of memory blocks is shown.

Figure 3:
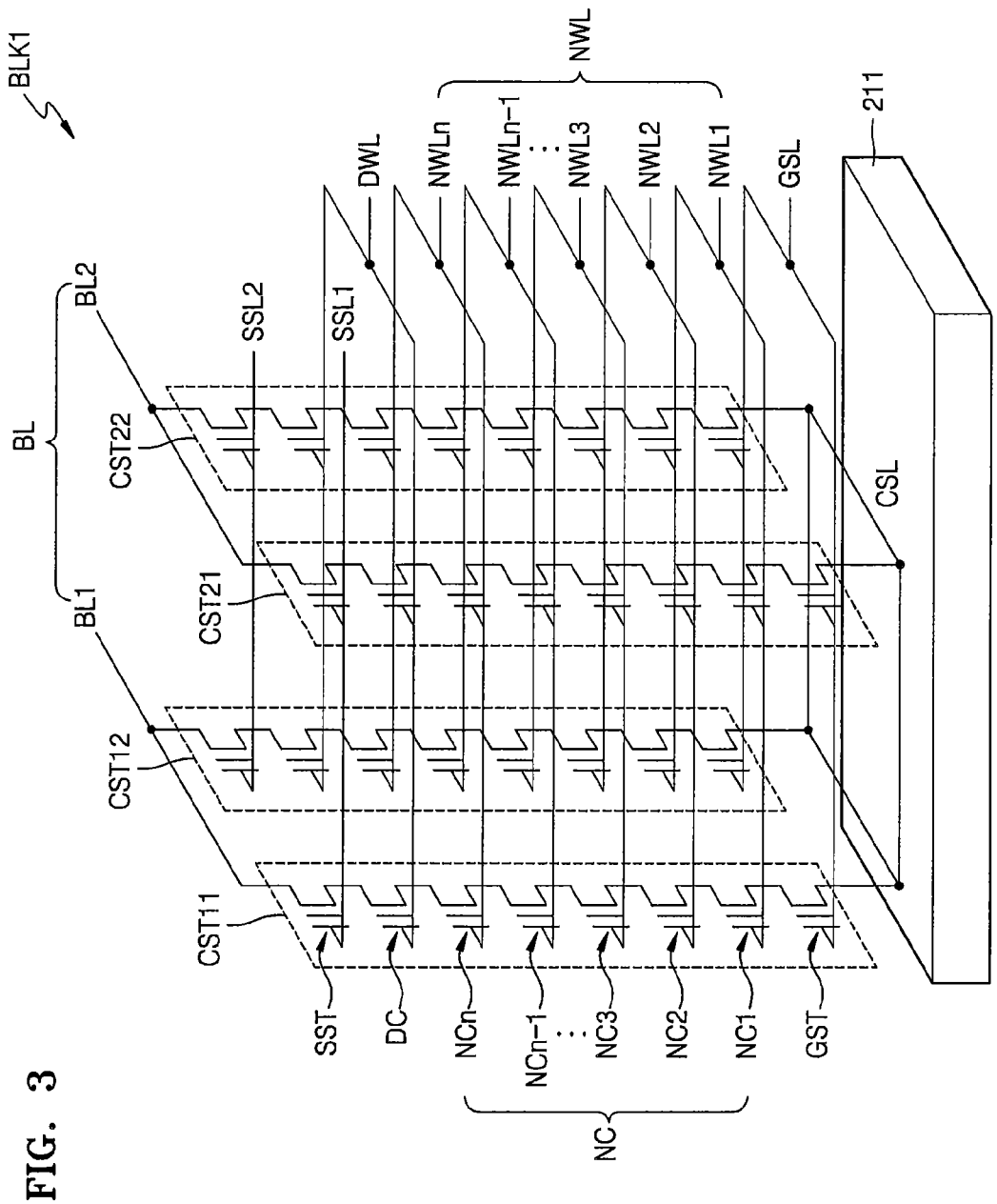
FIGS. 3 through 6 illustrate examples of a memory cell array of FIG. 1.

Referring to FIG. 3, the first memory block BLK1 may include a substrate 211, a plurality of cell strings CST, a dummy word line DWL, a normal word line NWL, a bit line BL, a ground selection line GSL, and a common source line CSL. Hereinafter, the number of cell strings CST, the number of word lines NWL, DWL, and the number of bit lines BL are described with reference to specific numbers or quantities for convenience. However, the number of cell strings CST, the number of word lines NWL, DWL, and/or the number of bit lines BL are not limited thereto and may vary. In addition, the number of normal cells NC included in each of the cell strings CST is not limited thereto and thus may vary.

Each cell string CST may be connected between the bit line BL and the common source line CSL. As described above, each cell string CST may extend vertically (i.e., in a Z-axis direction) from the substrate 211. Each cell string CST may include a string selection transistor SST, a dummy cell DC, a plurality of normal cells NC, and a ground selection transistor GST that are serially connected between the bit line BL and the common source line CSL. For example, a cell string CST11 among the cell strings CST may include a string selection transistor SST, a dummy cell DC, normal cells NC1 through NCn, and a ground selection transistor GST that are serially connected between a bit line BL1 among the bit lines BL and the common source line CSL.

The string selection transistor SST may be connected with a string selection line SSL extending in a column direction (i.e., an Y-axis direction) and thus may be controlled, and the ground selection transistor GST may be connected with the ground selection line GSL extending in a row direction (i.e., an X-axis direction) and the column direction (i.e., the Y-axis direction) and thus may be controlled. For example, the string selection transistor SST of the cell string CST11 may be connected with the string selection line SSL1 and thus may be controlled, and a string selection transistor SST of a cell string CST12 may be connected with a string selection line SSL2 and thus may be controlled. The respective ground selection transistors GST of the cell strings CST11, CST12, CST21, and CST22 may be co-connected with the ground selection line GSL that is shared therebetween, and thus may be controlled.

The dummy cell DC may be connected with the dummy word line DWL extending in the row direction (i.e., the X-axis direction) and the column direction (i.e., the Y-axis direction) and thus may be controlled, and each of the normal cells NC may be connected with the normal word line NWL extending in the row direction (i.e., the X-axis direction) and the column direction (i.e., the Y-axis direction) and thus may be controlled. For example, respective dummy cells DC of the cell strings CST11, CST12, CST21, and CST22 may be co-connected with the dummy word line DWL that is shared therebetween, and thus may be controlled. The dummy cells DC may be arranged so as to improve operational characteristics of the cell strings CST, respectively. For example, each dummy cell DC may be used so that each cell string CST is less affected due to the deterioration of each string selection transistor SST of each cell string CST, or deterioration of the string selection transistor SST of the cell string CST due to a difference between a voltage applied to the string selection transistor SST and a voltage applied to a normal cell NC during an operation with respect to the normal cell NC of the cell string CST.

Data is written to normal cells NC1 through NCn. The normal cells NC1 through NCn of the cell strings CST11, CST12, CST21, and CST22 may be co-connected with the normal word line NWL that is shared therebetween, and thus may be controlled.

The bit line BL may be connected with the cell strings CST that are arrayed in the row direction (i.e., the X-axis direction). For example, the cell string CST11 and the cell string CST12 may be connected with the bit line BL1, and the cell string CST21 and the cell string CST22 may be connected with a bit line BL2. As described above, the memory cell array 210 may include additional bit lines BL and/or cell strings CST than those shown in FIG. 3.

Figure 4:
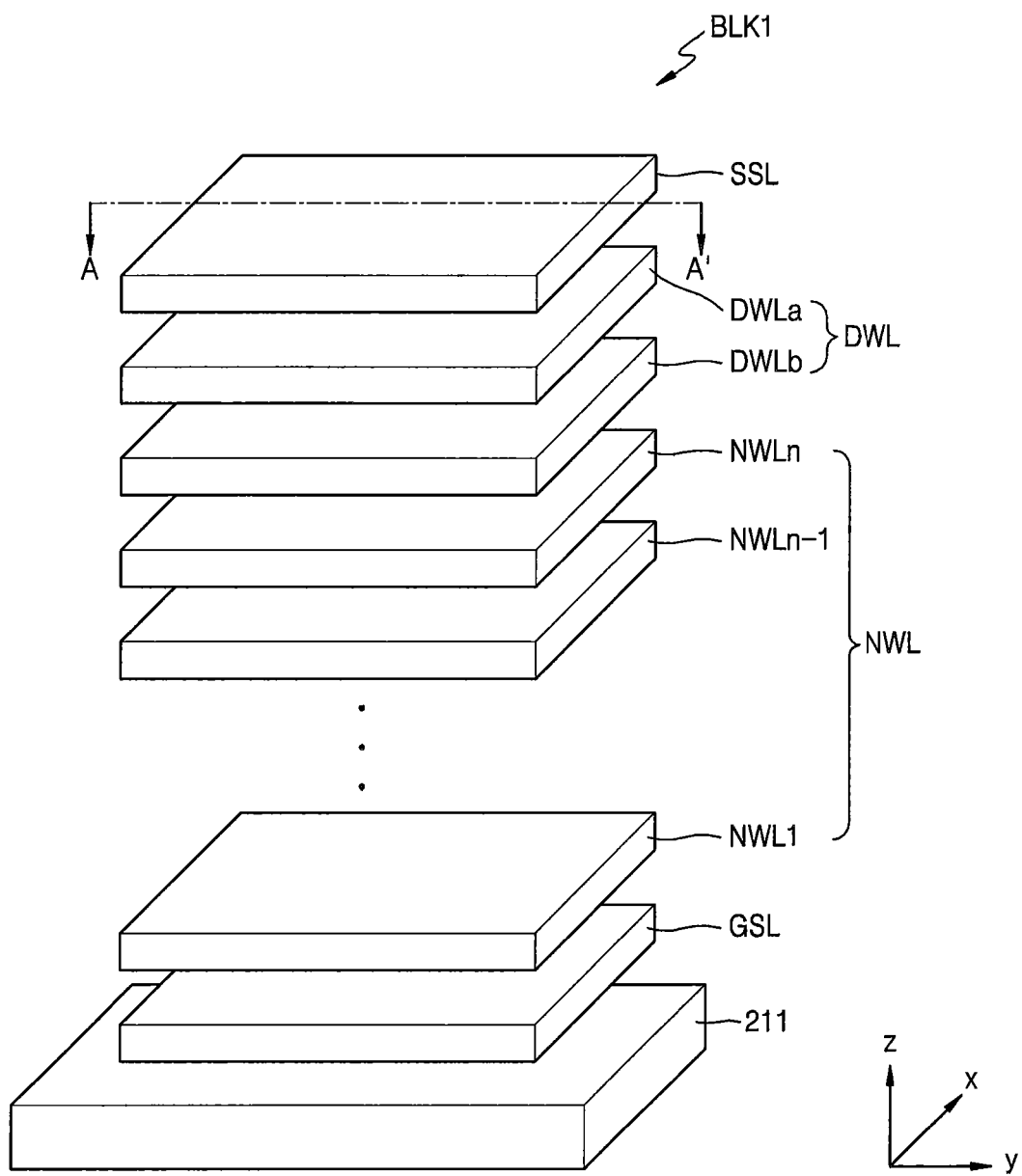

Referring to FIG. 3, each cell string CST includes one dummy cell DC but one or more embodiments of the inventive concepts are not limited thereto. Referring to FIG. 4, which is another example of the first memory block BLK1, layers that are stacked from the substrate 211 in a vertical direction (i.e., a Z-axis direction) include a string selection line SSL, a dummy word line DWL, a normal word line NWL, and a ground selection line GSL, respectively. The layers are connected with a string selection transistor SST, a dummy cell DC, normal cells NC, and a ground selection transistor GST of each of cell strings CST, and for convenience of illustration, a transistor or a cell that corresponds to each layer is not shown.

Figure 5:
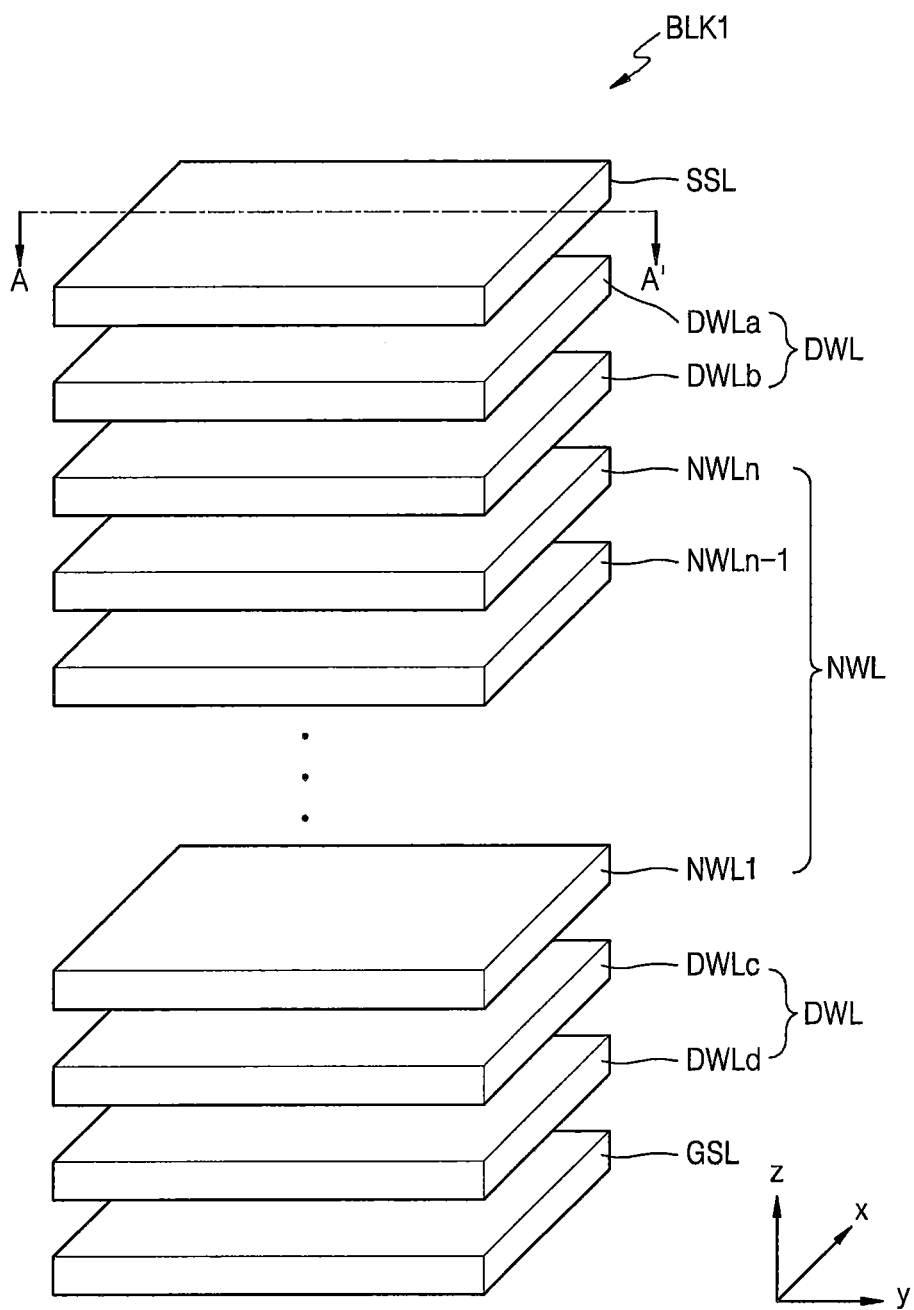

As shown in FIG. 4, the dummy word line DWL may be embodied as two layers DWLa and DWLb that are adjacent to the string selection line SSL. Referring to FIG. 5, which is another example of the first memory block BLK1, the dummy word line DWL may be arranged as two layers DWLa and DWLb that are adjacent to a string selection line SSL and as two layers DWLc, DWLd that are adjacent to a ground selection line GSL. However, one or more embodiments of the inventive concepts are not limited thereto, and thus the dummy word line DWL may be arranged so as to be adjacent to each of the string selection line SSL and the ground selection line GSL. The layer that is referred as the dummy cell DC or the dummy word line DWL may be arranged so as to reduce or minimize undesired effects in the cell string CST due to a voltage that is applied to the string selection line SSL, the dummy word line DWL, the normal word line NWL, and/or the ground selection line GSL during an operation of the memory device 200.

Figure 6:
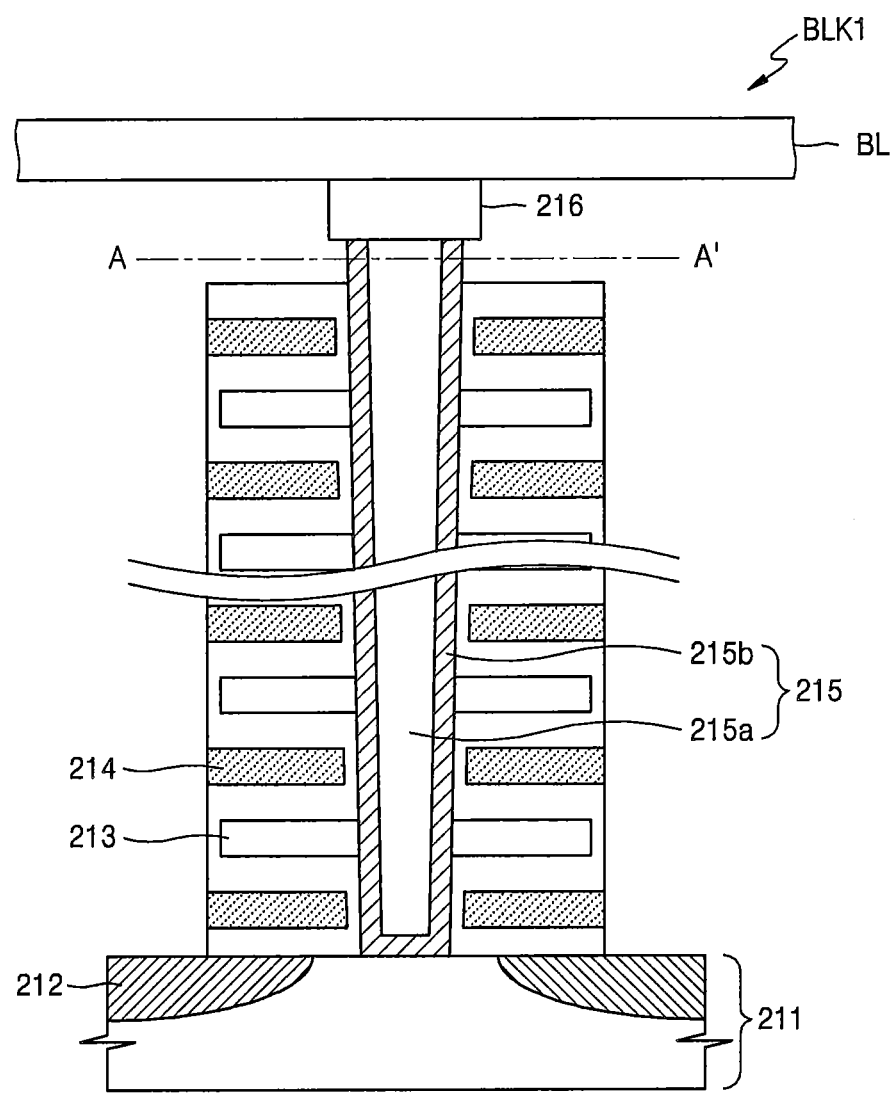

FIG. 6 is a cross-sectional view of the memory cell array of FIG. 4, taken along line A-A'. Referring to FIG. 6, in the substrate 211 that is of a first conductive type, a well 212 that is of a second conductive type that is different from the first conductive type is formed. For example, the first conductive type may be p-type, and the second conductive type may be n-type. However, embodiments of the inventive concepts are not limited thereto. An insulating pattern 213 and a conductive pattern 214 may be alternately formed on the two adjacent wells 212 that are a pair. The insulating pattern 213 may be silicon oxide, and the conductive pattern 214 may be polysilicon. The insulating pattern 213 and the conductive pattern 214 may be formed by chemical vapor deposition (CVD). Gates of the string selection transistor SST, the dummy cell DC, the normal cells NC, and the ground selection transistor GST may be embodied by the conductive pattern 214.

A channel structure 215 that connects the substrate 211 and a contact plug 216 (i.e., a drain) may be formed between two stack structures where the insulating pattern 213 and the conductive pattern 214 are alternately stacked. The channel structure 215 may include a pillar 215a and a channel region 215b. The pillar 215a of the channel structure 215 may be formed of an insulating material.

As described above, the string selection transistor SST, the dummy cell DC, the normal cells NC, and the ground selection transistor GST that are included in one cell string CST may share the same channel. As illustrated in FIG. 6, the channel structure 215 may extend in the Z-axis direction that is perpendicular to the substrate 211. The channel structure 215 may be a channel last structure (e.g., a bit-cost scalable (BiCS) structure) where a conductive pattern is first formed and then the channel structure 215 is formed, or may be a channel first structure (e.g., a terabit cell array transistor (TCAT) structure) where the channel structure 215 is first formed and then the conductive pattern is formed.

Referring back to FIG. 1, the voltage generating unit 220 of the memory device 200 generates various types of voltages for the program, read, and erase operations with respect to the memory cell array 210. For example, the voltage generating unit 220 may generate a string selection voltage that is provided to a word line of the string selection transistor SST and may generate a dummy word line voltage that is provided to a word line of the dummy cell DC. The voltage generating unit 220 may generate a normal word line voltage that is provided to word lines of the normal cells NC and may generate a ground selection voltage that is provided to a word line of the ground selection transistor GST. Also, the voltage generating unit 220 may generate voltages having different levels and thus may provide the voltages to the word lines and bit lines whenever the program, read, and erase operations are performed.

In the present embodiment, the control logic 230 may perform a control operation related to a memory operation including the program, read, erase operations, etc. For example, during the memory operation, the control logic 230 may control the voltage generating unit 220 and thus may control a timing of generating word line voltages. In other embodiments, during the memory operation, the control logic 230 may control the voltage generating unit 220 and thus may control a timing of providing the word line voltages to a row decoder (not shown). In other embodiments, the control logic 230 may control the row decoder and thus may control a timing of providing the word line voltages to the word lines. By performing the aforementioned timing controls, the timings of providing the various voltages (e.g., the string selection voltage, the dummy word line voltage, the normal word line voltage, the ground selection voltage, etc.) to the word lines may be controlled.

Hereinafter, word lines are defined to include the string selection line, the dummy/normal word lines, and the ground selection line. That is, during the memory operation, a voltage signal having a level that corresponds to each of the memory operations may be provided to the string selection line, the dummy/normal word lines, and the ground selection lines, and the voltage signal that is provided to each of the lines may be defined as a word line voltage.

Figure 2:
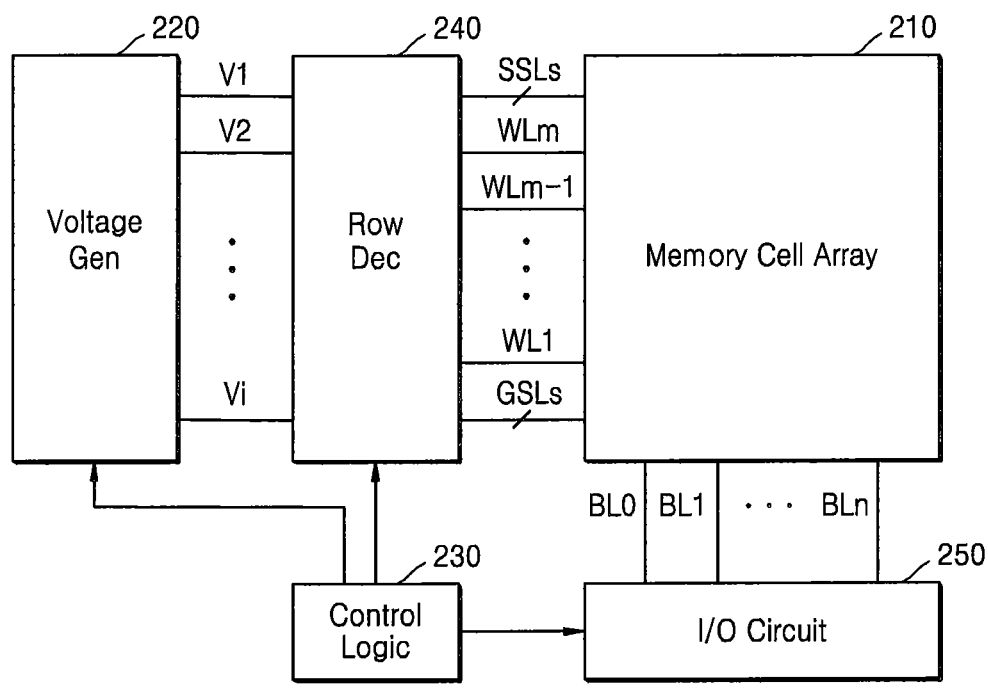
FIG. 2 is a block diagram of a memory device of FIG. 1, according to some embodiments of the inventive concepts.

FIG. 2 is a block diagram of the memory device 200 of FIG. 1, according to some embodiments of the inventive concepts. As illustrated in FIG. 2, the memory device 200 may include the memory cell array 210, the voltage generating unit 220, and the control logic 230. Also, the memory device 200 may further include a row decoder 240 and an input/output (I/O) circuit 250.

The memory cell array 210 may be connected with one or more string selection lines SSLs, a plurality of word lines WL1 through WLm (that include a normal word line and a dummy word line), one or more ground selection lines GSLs, and a plurality of bit lines BL1 through BLn. The voltage generating unit 220 may generate one or more word line voltages V1 through Vi that may be provided to the row decoder 240. Also, data to be programmed may be provided to the memory cell array 210 via the I/O circuit 250, and read data may be provided to an external source via the I/O circuit 250. The control logic 230 may provide various control signals related to a memory operation to the row decoder 240, the voltage generating unit 220, and the I/O circuit 250.

The word line voltages V1 through Vi generated by the voltage generating unit 220 may have levels that correspond to various memory operations. For example, one word line may be connected with a plurality of memory cells that may be positioned between a bit line and a ground selection line. When a memory cell that is selected among the memory cells is defined as a first memory cell, the word line voltages V1 through Vi may include a first voltage (e.g., a first pass voltage) that is provided to the word line connected with the first memory cell, and may include voltages that are provided to the word line connected with non-selected memory cells among the memory cells. For example, when one or more non-selected memory cells between the first memory cell and the ground selection line are defined as a second memory cell, the word line voltages V1 through Vi may include a second voltage (e.g., a second pass voltage) that is provided to the word line connected with the second memory cell. Also, when one or more non-selected memory cells between the first memory cell and the bit line are defined as a third memory cell, the word line voltages V1 through Vi may include a third voltage (e.g., a third pass voltage) that is provided to the word line connected with the third memory cell.

According to a decoding operation of the row decoder 240, the word line voltages V1 through Vi may be provided to various word lines, namely, string selection lines SSLs, word lines WL1 through WLm, and ground selection lines GSLs. For example, the word line voltages V1 through Vi may include a string selection voltage, a word line voltage, and a ground selection voltage, and in this regard, the string selection voltage may be provided to one or more string selection lines SSLs, the word line voltage may be provided to one or more word lines (including dummy and normal word lines WL1 through WLm), and the ground selection voltage may be provided to one or more ground selection lines GSLs.

Figure 7:
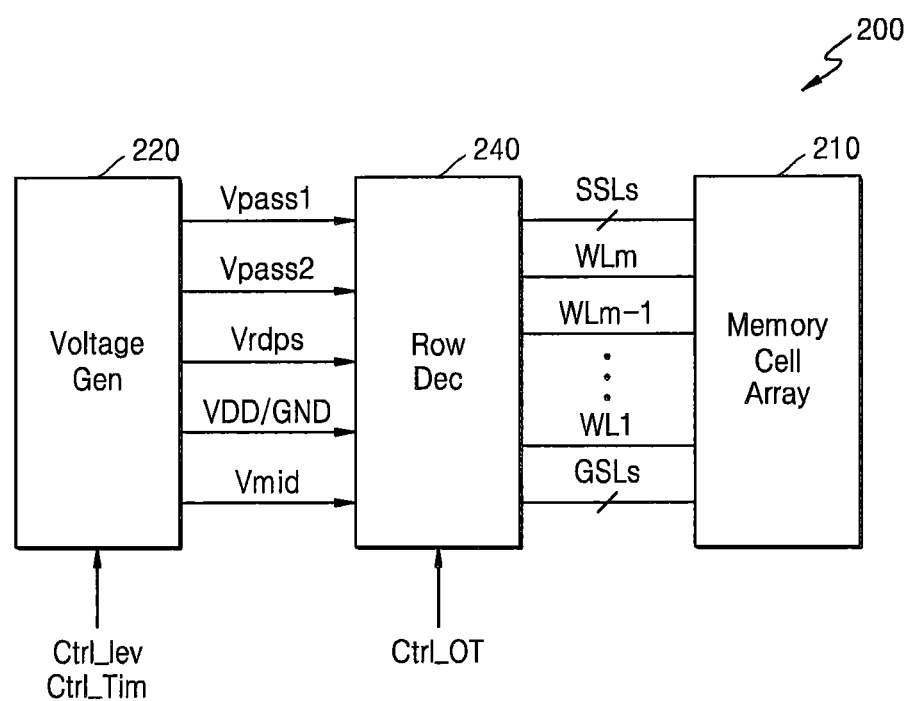
FIG. 7 is a block diagram of an example where a word line voltage is provided during a memory operation, according to some embodiments of the inventive concepts.

FIG. 7 is a block diagram of an example where a word line voltage is provided during a memory operation, according to some embodiments of the inventive concepts. In the example of FIG. 7, the memory operation is a program operation.

The voltage generating unit 220 generates word line voltages, in response to various control signals, namely, a level control signal Ctrl_lev and a timing control signal Ctrl_Tim, from a control logic. For example, the voltage generating unit 220 may generate a first voltage (e.g., a first pass voltage Vpass1) to be provided to a selected word line, and second and third voltages (e.g., second and third pass voltages Vpass2 and Vrdps) to be provided to non-selected word lines. Also, the voltage generating unit 220 may provide a power voltage VDD and a ground voltage GND to the row decoder 240. According to the present embodiment, in order to decrease the occurrence of hot carrier injection (HCI) during the program operation, the voltage generating unit 220 may generate at least one intermediate voltage Vmid having a predetermined voltage level and may provide the at least one intermediate voltage Vmid to the row decoder 240.

In the present embodiment, levels of the word line voltages, namely, a first pass voltage Vpass1, a second pass voltage Vpass2, a third pass voltage Vrdps, and an intermediate voltage Vmid, may vary, based on the control signals, namely, the level control signal Ctrl_lev and the timing control signal Ctrl_Tim. Also, a timing of outputting the word line voltages, namely, a first pass voltage Vpass1, a second pass voltage Vpass2, a third pass voltage Vrdps, and an intermediate voltage Vmid, to the row decoder 240 may be controlled, based on the control signals, namely, the level control signal Ctrl_lev and the timing control signal Ctrl_Tim. Additionally or alternatively, the row decoder 240 may control a timing of outputting the word line voltages, namely, a first pass voltage Vpass1, a second pass voltage Vpass2, a third pass voltage Vrdps, and an intermediate voltage Vmid, to the one or more word lines, based on a timing control signal Ctrl_OT.

In the present embodiment, at least one control signal among the aforementioned various controls signals, namely, the level control signal Ctrl_lev and timing control signals Ctrl_Tim and Ctrl_OT, may be generated. For example, based on the level control signal Ctrl_lev, a level of word line voltages may vary and a rising time of the word line voltages may be delayed, so that the word line voltages may be delayed and thus may be provided to word lines. Alternatively, the level of the word line voltages may be controlled based on the level control signal Ctrl_lev, and at least one of the voltage generating unit 220 and the row decoder 240 may be controlled based on the timing control signals Ctrl_Tim and Ctrl_OT, so that a timing of providing the word line voltages to the word lines may be adjusted.

Figure 8A:
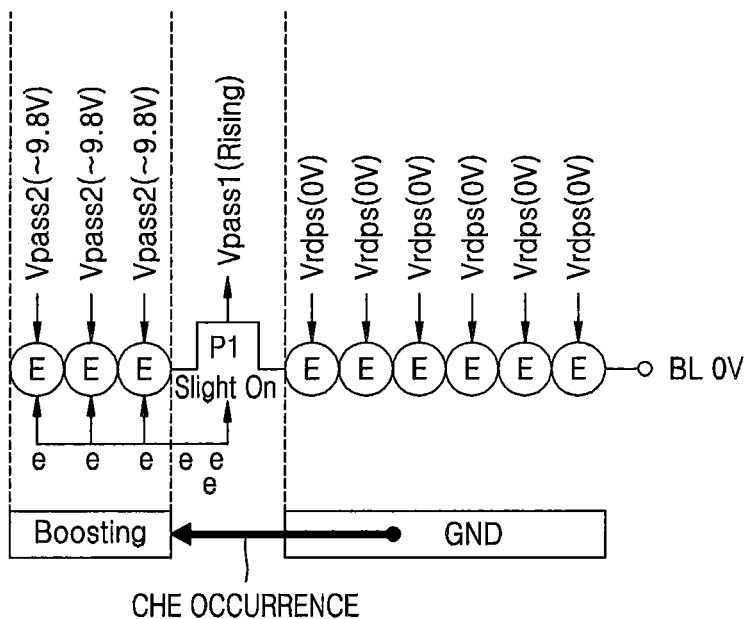
FIGS. 8A and 8B illustrate an example where hot carrier injection (HCI) occurs during a program operation.
Figure 8B:
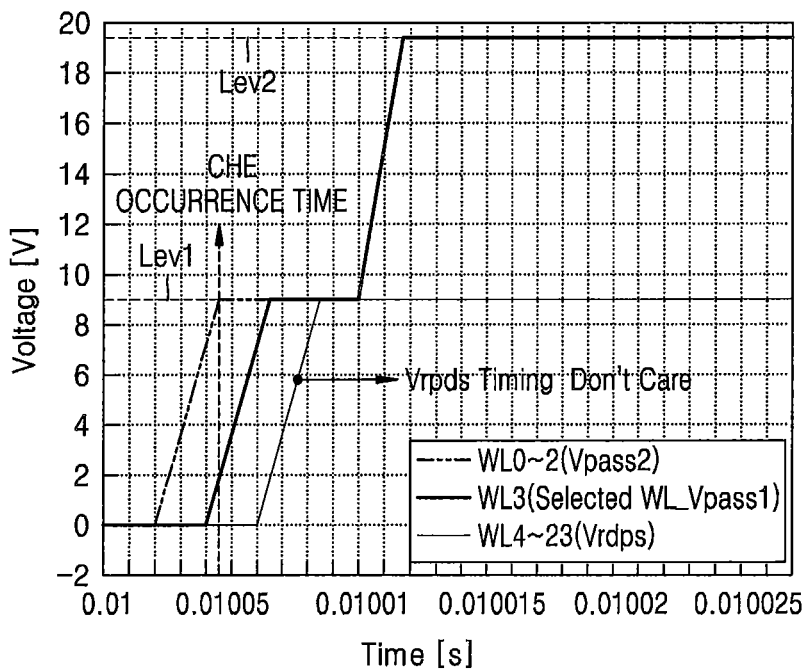

FIGS. 8A and 8B illustrate an example where HCI occurs during a program operation. As illustrated in the example of FIG. 8A, a plurality of memory cells are connected with one word line, and a first voltage (e.g., a first pass voltage Vpass1) is provided to a word line (i.e., a selected word line) that is connected with a selected memory cell (e.g., a first memory cell). Also, the memory cells are connected between a bit line and a ground selection line (not shown), and a second voltage (e.g., a second pass voltage Vpass2) may be provided to a word line (i.e., a first non-selected word line) connected with one or more memory cells (e.g., second memory cells) that are connected between the selected memory cell and the ground selection line. Also, a third voltage (e.g., a third pass voltage Vrdps) is provided to a word line (i.e., a second non-selected word line) connected with one or more memory cells (e.g., third memory cells) that are connected between the selected memory cell and the bit line. Also, in the example of FIG. 8A, it is assumed that the second memory cells and the third memory cells are in an erased state.

The first through third voltages Vpass1, Vpass2, and Vrdps may rise to a first level Lev 1. The first level Lev 1 may have a predetermined voltage level. For example, each of the first through third voltages Vpass1, Vpass2, and Vrdps may have a rising time in a predetermined period and may rise to a predetermined voltage level (e.g., 9.8 V), which may be sufficient to turn on a memory cell. The first voltage Vpass1 that is provided to the selected word line may rise to a program voltage Lev 2 having a voltage level sufficient to program a memory cell (e.g., 19.6 V). Also, the bit line may have a ground voltage level, and the ground selection line may be in a floating state.

If the second voltage Vpass2 reaches the first level Lev 1 before the first voltage Vpass1 rises to the first level (Lev 1), the first memory cell is slightly turned on by the first voltage Vpass1, and as word lines that are connected with the second memory cells are boosted, channel hot electron (CHE) injection occurs in a direction from the third memory cells toward the second memory cells. Also, since HCI occurs in the first memory cell due to the CHE, a threshold voltage of the first memory cell rises. On the other hand, since the third memory cells are not connected with the bit line having the ground voltage level, HCI does not occur in the third memory cells. Under this condition, when the CHE occurs, the threshold voltage of the first memory cell may unintentionally rise, such that program characteristics thereof may deteriorate.

Figure 9:
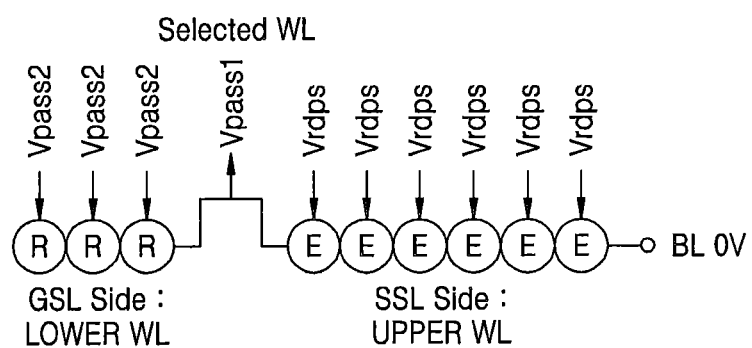
FIGS. 9 and 10 illustrate examples where HCI decreases during a program operation, according to some embodiments of the inventive concepts.
Figure 10:
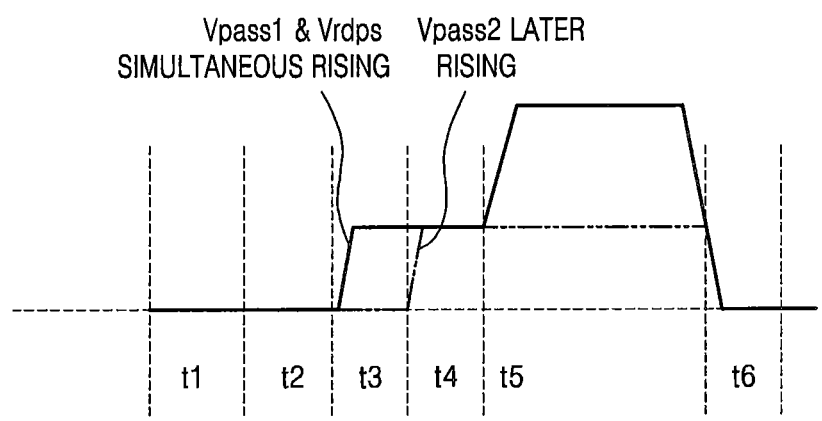

FIGS. 9 and 10 illustrate examples where HCI decreases during a program operation, according to some embodiments of the inventive concepts. Similar to the example of FIG. 8A, in the example of FIG. 9, a plurality of memory cells are connected with one word line, a first voltage (e.g., a first pass voltage Vpass1) is provided to a word line (i.e., a selected word line) that is connected with a selected memory cell (e.g., a first memory cell), a second voltage (e.g., a second pass voltage Vpass2) is provided to a word line (i.e., a first non-selected word line) that is connected with one or more second non-selected memory cells (memory cells of a GSL side or a lower word line), and a third voltage (e.g., a third pass voltage Vrdps) is provided to a word line (i.e., a second non-selected word line) that is connected with one or more third non-selected memory cells (memory cells of an SSL side or a upper word line).

As illustrated in FIG. 10, in the present embodiment, rising times of the first through third voltages Vpass1, Vpass2, and Vrdps may be controlled. For example, the first voltage Vpass1 first rises at a predetermined time (e.g., t3) and then the second voltage Vpass2 rises at another predetermined time (e.g., t4). The first voltage Vpass1 and the second voltage Vpass2 may rise to a first level. Afterward, at a predetermined time (e.g., t5), the first voltage Vpass1 may rise to a second level that corresponds to a program level, and afterward, when a level of the first voltage Vpass1 falls, a level of the second voltage Vpass2 may fall at a predetermined time (e.g., t6).

According to the present embodiment, memory cells that are connected with the second non-selected word line to which the third voltage Vrdps is applied are electrically connected with the bit line having a ground voltage level, so that the second non-selected word line is not boosted. Accordingly, a don't care condition may be applied to a rising time of the third voltage Vrdps. FIG. 10 illustrates an example where the first voltage Vpass1 and the third voltage Vrdps rise at the same time.

Figure 11:
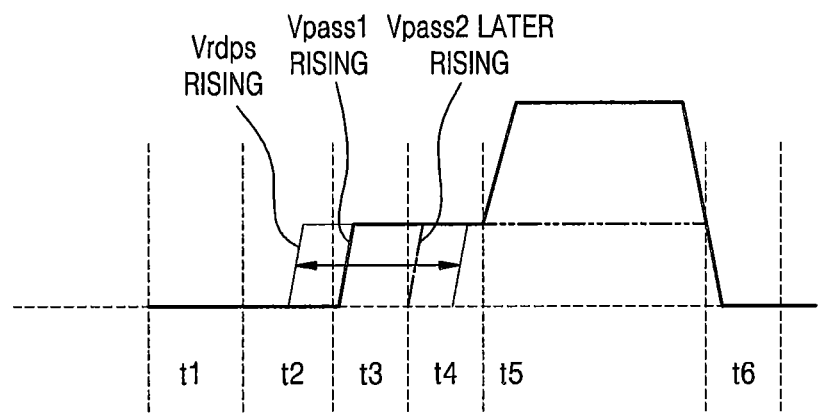
FIG. 11 illustrates an example where HCI decreases during a program operation, according to other embodiments of the inventive concepts.

FIG. 11 illustrates an example where HCI decreases during a program operation, according to other embodiments of the inventive concepts. As described above, since a second non-selected word line is not boosted, a don't care condition may be applied to a rising time of a third voltage Vrdps. For example, as shown in FIG. 11, the third voltage Vrdps may rise at a time earlier than a time of a first voltage Vpass1, or may rise at a time later than a time of a second voltage Vpass2. Also, the third voltage Vrdps may rise after the first voltage Vpass1 rises, or the second voltage Vpass2 may rise after the third voltage Vrdps rises.

In the examples of FIGS. 10 and 11, the first memory cell is first turned on (e.g., the first memory cell is strongly turned on) and then the second voltage Vpass2 rises. Accordingly, although the second voltage Vpass2 rises because the memory cells that are connected with the first non-selected word line are electrically connected with the bit line, the occurrence of boosting the first non-selected word line may be decreased, so that an increase in HCI in the first memory cell may be reduced or prevented.

When the first memory cell is a multi-level cell that stores at least two bits, a plurality of program operations may be performed on the first memory cell. In this regard, an operation of controlling rising times of the first through third voltages Vpass1, Vpass2, and Vrdps shown in the examples of FIGS. 10 and 11 may be performed during one of the program operations or during all of the program operations. For example, the present embodiment may be applied to two-bit data during its program state (e.g., P1, P2, and P3) other than its erase state. In a P1 state where a level of a threshold voltage is relatively low, the first memory cell may be slightly turned on according to a rising time of the first voltage Vpass1, so that a voltage rising time according to the present embodiment may be applied to the memory cells during a program operation in the P1 state. On the other hand, in P2 and P3 states where the level of the threshold voltage is relatively high, the first memory cell is turned off (or is not slightly turned on), regardless of the rising time of the first voltage Vpass1, so that a possibility that HCI may occur in the first memory cell is small and thus the voltage rising time according to the present embodiment may not be applied to the memory cells.

Figure 12:
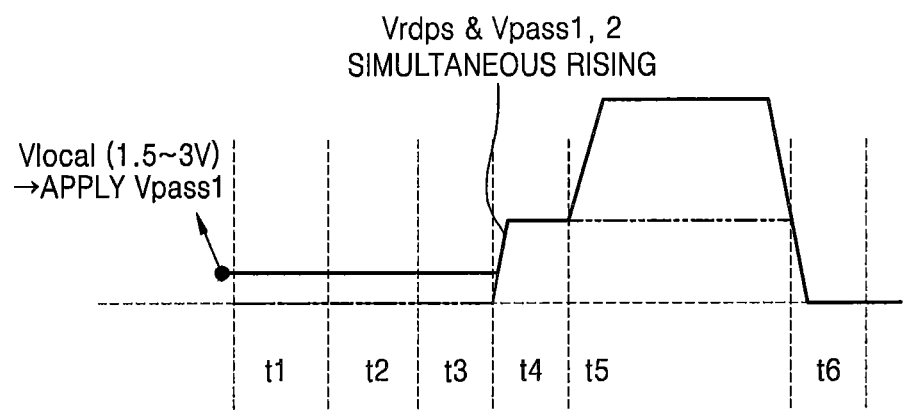
FIG. 12 illustrates an example where HCI decreases during a program operation, according to other embodiments of the inventive concepts.

FIG. 12 illustrates an example where HCI decreases during a program operation, according to other embodiments of the inventive concepts. In the embodiment of FIG. 12, a first voltage Vpass1 may maintain a value (e.g., the level may be referred as an intermediate level Vmid or a third level Vlocal) between a ground voltage and a first level. Since the first voltage Vpass1 having the third level Vlocal is applied to a selected word line, a first memory cell may be turned on, and second memory cells may be electrically connected with a bit line having a ground voltage level.

Afterward, a first voltage Vpass1, a second voltage Vpass2, and a third voltage Vrdps may rise at a predetermined time (e.g., t3). For example, the first voltage Vpass1 may rise from the third level Vlocal to a first level, and the second voltage Vpass2 and the third voltage Vrdps may rise from the ground voltage level to the first level. Afterward, the first voltage Vpass1 may rise to a second level (such as a program voltage level) at a predetermined time (e.g., t5), and the second voltage Vpass2 and the third voltage Vrdps may maintain the first level. Afterward, when a level of the first voltage Vpass1 falls, levels of the second voltage Vpass2 and the third voltage Vrdps may fall at a predetermined time (e.g., t6).

In the embodiment of FIG. 12, although the level of the second voltage Vpass2 rises, since the first memory cell is already turned on by the first voltage having the third level Vlocal, the occurrence of boosting a first non-selected word line may be decreased, so that HCI in the first memory cell may be decreased. Accordingly, a phenomenon where a threshold voltage of the first memory cell rises due to HCI may be decreased.

Figure 13:
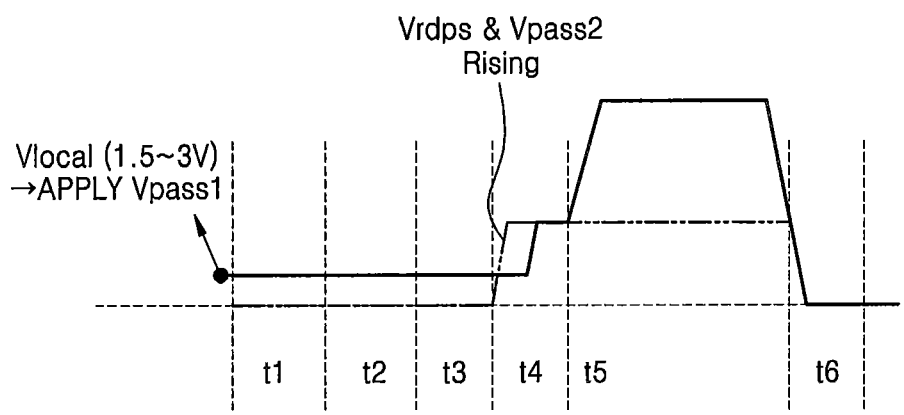
FIG. 13 illustrates a modified example of a timing diagram shown in FIG. 12 according to other embodiments of the inventive concepts.

FIG. 13 illustrates a modified example of a timing diagram shown in FIG. 12 according to other embodiments of the inventive concepts. In the embodiment of FIG. 12, the first voltage Vpass1, the second voltage Vpass2, and the third voltage Vrdps simultaneously rise to the first level, but, as shown in FIG. 13, a time when the first voltage Vpass1 rises to the first level may be later than a time when the second voltage Vpass2 rises to the first level.

For example, although the second voltage Vpass2 rises to the first level at a predetermined time (e.g., t3), the first voltage Vpass1 already maintains the third level Vlocal, so that the first memory cell remains at a turned-on state. Accordingly, regardless of a rising time of the second voltage Vpass2, a boosting operation with respect to the first non-selected word line may be decreased, and an increase in the threshold voltage of the first memory cell due to HCI may be decreased or prevented. In the embodiment of FIG. 13, the second voltage Vpass2 and a third voltage Vrdps simultaneously rise to the first level by way of example. However, as shown in the previous embodiments, a don't care condition may be applied to a rising time of the third voltage Vrdps.

Figure 14:
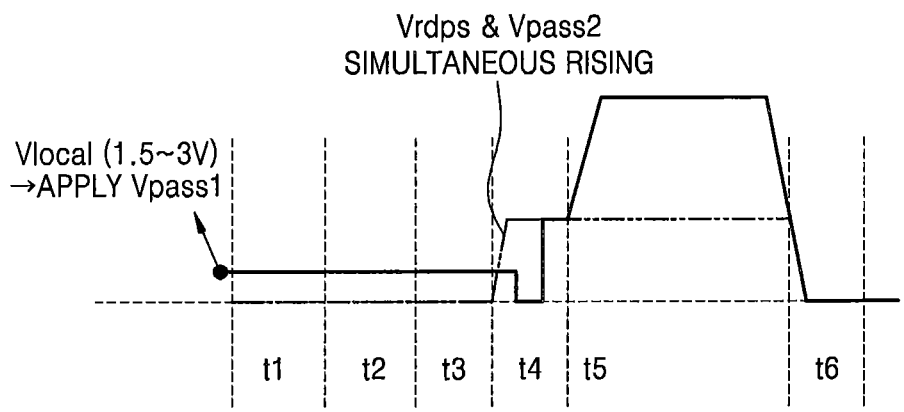
FIG. 14 illustrates a modified example of a timing diagram shown in FIG. 12, according to other embodiments of the inventive concepts.

FIG. 14 illustrates a modified example of a timing diagram shown in FIG. 12, according to other embodiments of the inventive concepts. In the embodiment of FIG. 12, the first voltage Vpass1 maintains the third level Vlocal, but, as shown in FIG. 14, a first voltage Vpass1 may transition to a ground voltage level and then may rise to a first level.

Although only one cell string is illustrated in FIG. 9, the first voltage Vpass1, the second voltage Vpass2, and the third voltage Vrdps may be provided to other cell strings during a program operation. In a case of a cell string including a memory cell to be programmed, a voltage rising time control operation as described in the previous embodiments may be applied to the cell string, so that it may be less affected by HCI. On the other hand, in a case of a non-selected cell string (e.g., an inhibit string), it may be required to perform a boosting operation on a word line with the first voltage Vpass1, the second voltage Vpass2, and the third voltage Vrdps.

In the embodiment of FIG. 14, the first voltage Vpass1 may transition from a third level Vlocal to a ground voltage level at a predetermined time, for example, the first voltage Vpass1 may transition to the ground voltage level at a time between specific times t3 and t4. In one or more embodiments of the inventive concepts, the time when the first voltage Vpass1 transitions to the ground voltage level is not limited to the embodiment of FIG. 14, and a don't care condition may be applied to a rising time of the third voltage Vrdps. Also, in the embodiment of FIG. 14, since a word line of the inhibit string, which receives the first voltage Vpass1, also rises from the ground voltage level to the first level, a boosting effect may be generated due to the voltage rise.

Figure 15:
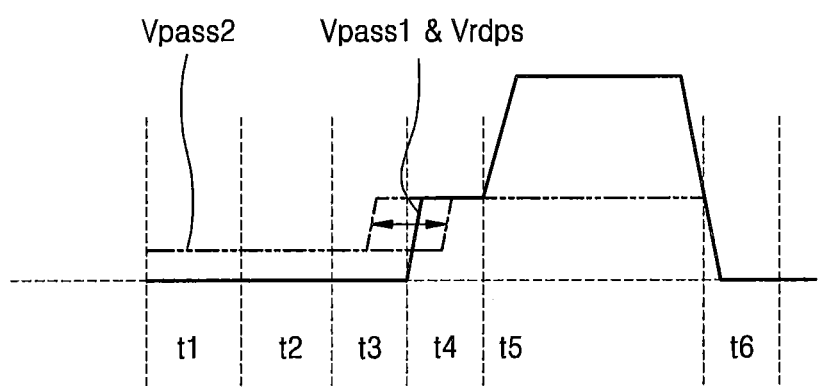
FIG. 15 illustrates an example where HCI decreases during a program operation, according to other embodiments of the inventive concepts.

FIG. 15 illustrates an example where HCI decreases during a program operation, according to other embodiments of the inventive concepts. In the embodiment of FIG. 15, a second voltage Vpass2 may rise according to at least two steps, that is, sequentially between a ground voltage and an intermediate voltage that is less than the first voltage level, and then between the intermediate voltage and the first voltage level. Referring to FIG. 15, the second voltage Vpass2 rises in two steps, so that the second voltage Vpass2 may maintain an intermediate voltage level until a predetermined time and then may rise to a first level. In other words, a rise time of the second voltage Vpass2 defines a step function. A time when the second voltage Vpass2 rises to the first level may be earlier or later than a time when a first voltage Vpass1 rises to the first level. Also, referring to FIG. 15, the first voltage Vpass1 and a third voltage Vrdps simultaneously rise to the first level, but a don't care condition may be applied to a rising time of the third voltage Vrdps.

In the embodiment of FIG. 15, although the second voltage Vpass2 rises to the first level before the first voltage Vpass1 rises, since the second voltage Vpass2 rises from an intermediate level to the first level (or, since an increase in the second voltage Vpass2 may be decreased), boosting thereof may be reduced. In some embodiments, the intermediate level of the second voltage Vpass2 may be insufficient to turn on the second memory cell. Alternatively, when the second voltage Vpass2 rises to the first level after the first voltage Vpass1 rises, since a first memory cell is already turned on, boosting on a first non-selected word line may be decreased.

Figure 16:
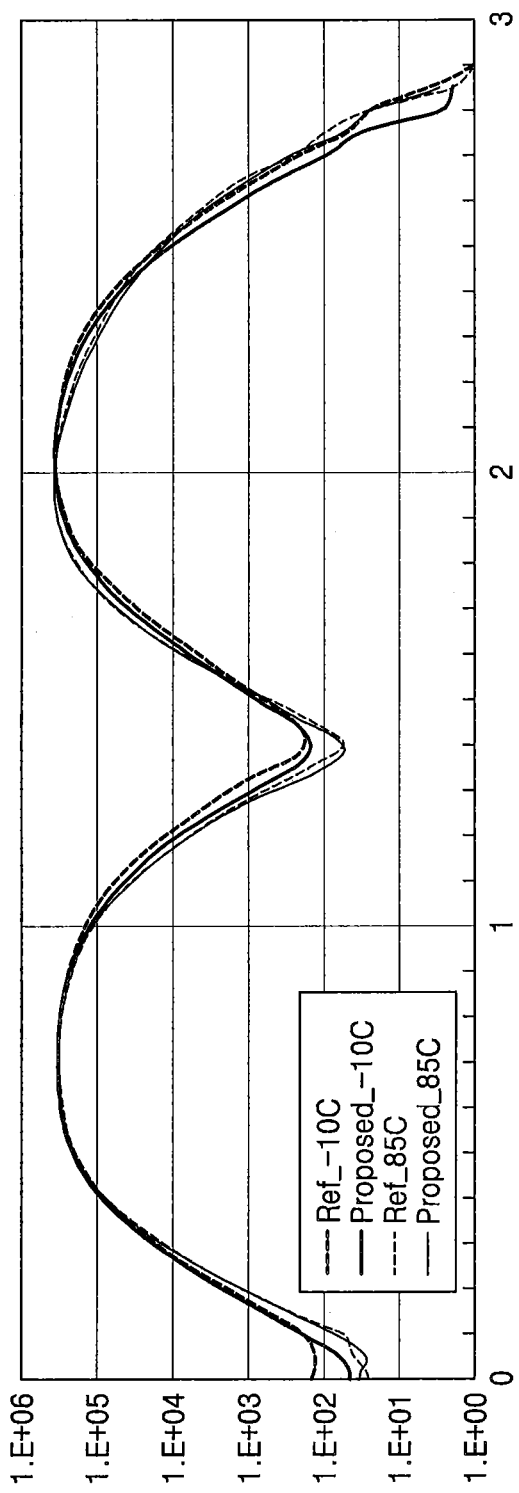
FIG. 16 is a graph illustrating a distribution characteristic depending on an operation of a non-volatile memory device, according to some embodiments of the inventive concepts.

FIG. 16 is a graph illustrating threshold voltage distribution characteristics depending on an operation of the memory device 200, according to some embodiments of the inventive concepts. As illustrated in FIG. 16, the distribution of reference threshold voltages (for example, according to the prior art) and the distribution of threshold voltages according to the present embodiment during program operations in different temperatures may be different from each other. As illustrated in FIG. 16, a window of the distribution of the threshold voltages during the program operations according to the present embodiment was relatively narrow.

Figure 17A:
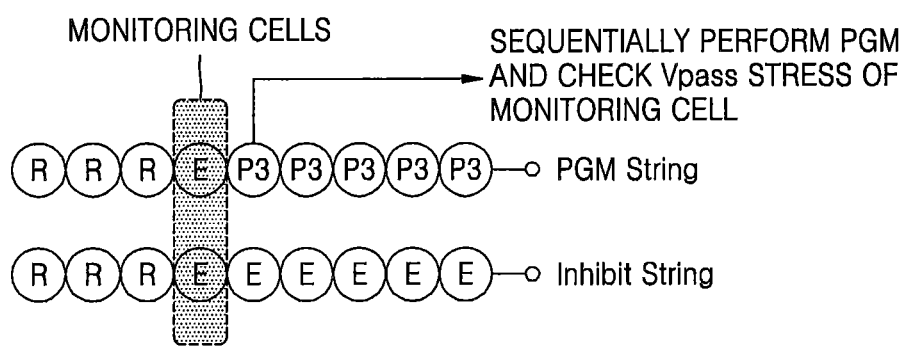
FIGS. 17A and 17B illustrate an example where the distribution of threshold voltages is checked after a voltage rising time is applied thereto, according to some embodiments of the inventive concepts.
Figure 17B:
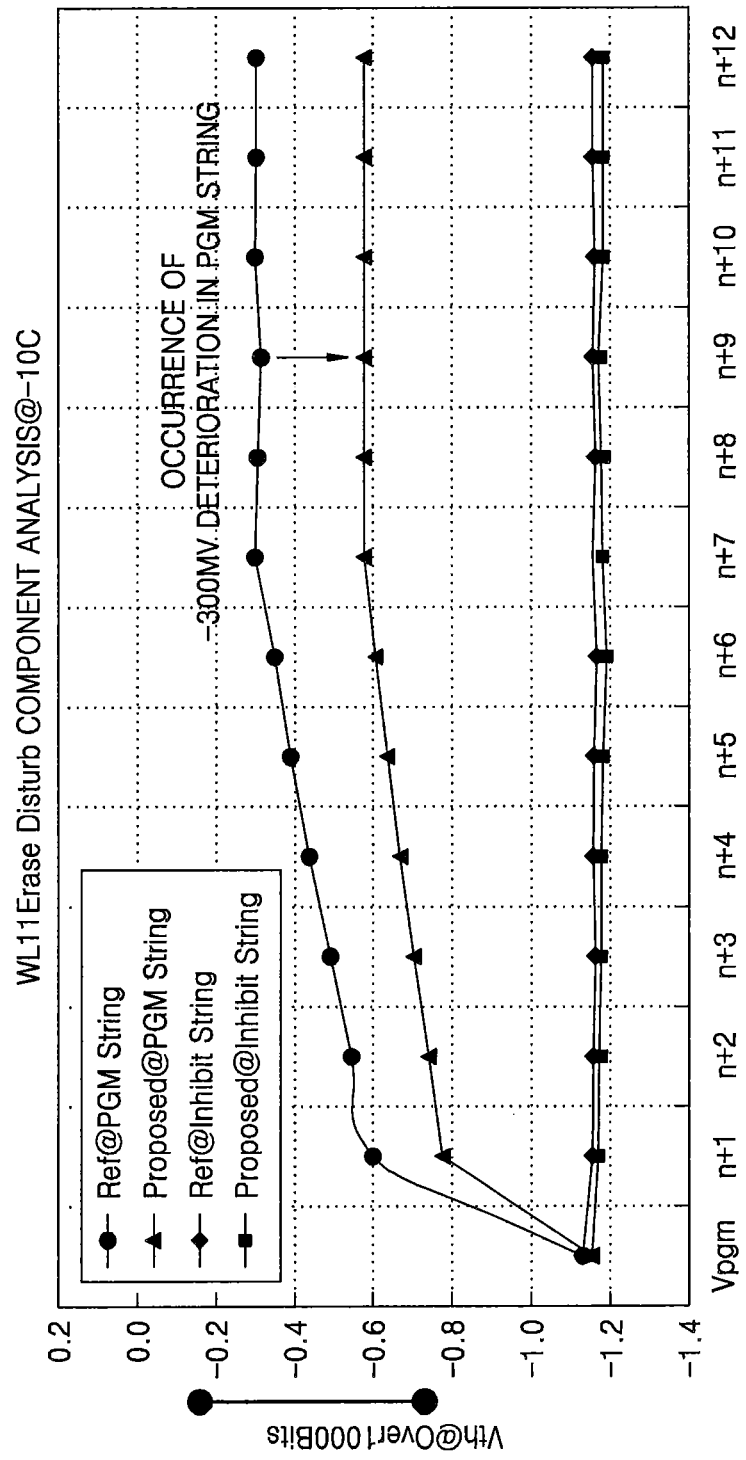

FIGS. 17A and 17B illustrate an example where the distribution of threshold voltages is checked after a voltage rising time is applied thereto, according to some embodiments of the inventive concepts. As shown in FIG. 17A, a predetermined monitoring cell E is set, and a program operation is performed on a plurality of memory cells P3 that are adjacent to the predetermined monitoring cell E in a right direction. According to the program operation with respect to the memory cells P3, a threshold voltage of the predetermined monitoring cell E may be increased due to HCI. As shown in FIG. 17B, in a case of memory cells of an inhibit string, the threshold voltage of the predetermined monitoring cell E approximately has a constant value. On the other hand, in a case of a program string PGM String, since a program operation is sequentially performed on the memory cells P3, the threshold voltage of the predetermined monitoring cell E may be gradually or gradationally increased. Here, when the voltage rising time according to some embodiments of the inventive concepts is applied to the memory cells, the amount of increase in the threshold voltage decreases.

Figure 18:
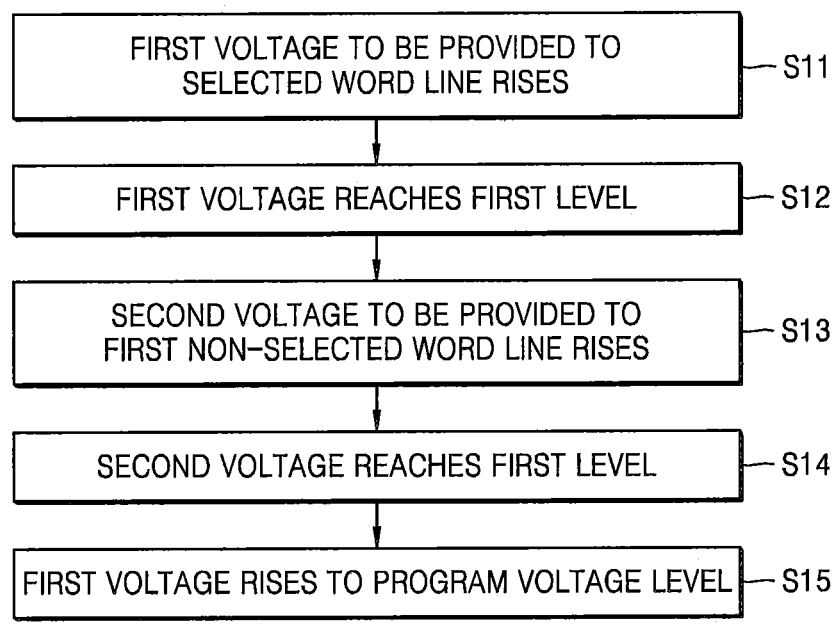
FIGS. 18 and 19 are flowcharts of operating methods of the non-volatile memory device, according to embodiments of the inventive concepts.
Figure 19:
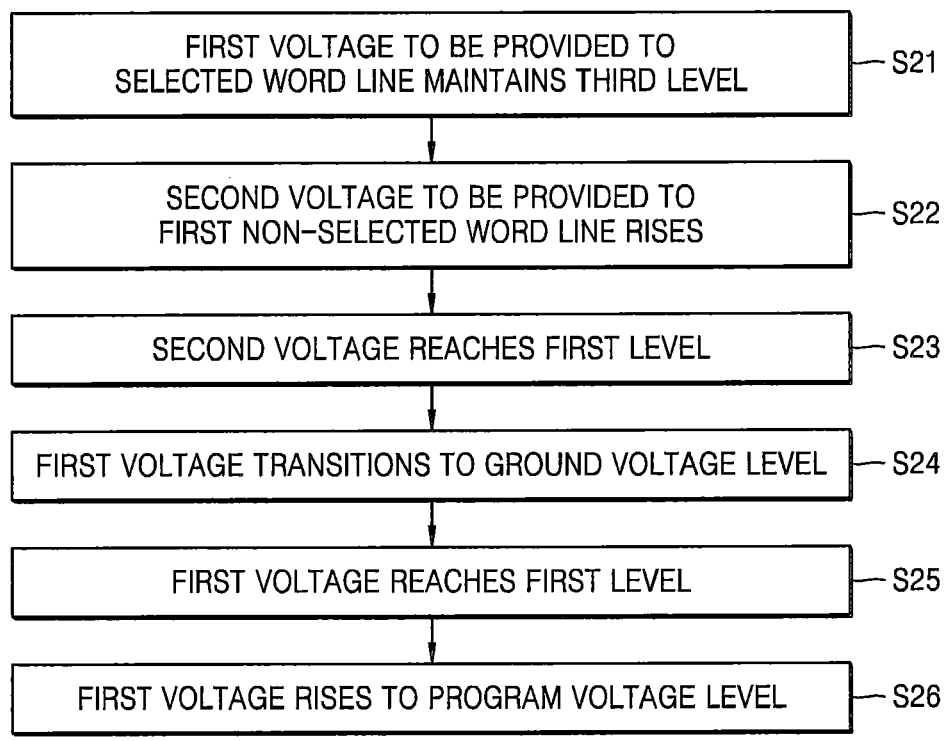

FIGS. 18 and 19 are flowcharts of operating methods of the memory device 200, according to embodiments of the inventive concepts. Regarding a voltage rising time described in the previous embodiments, FIG. 18 illustrates an example where a first voltage rises to a first level before a second voltage does, and FIG. 19 illustrates an example where a don't care condition is applied to rising times of the first voltage and the second voltage.

As illustrated in FIG. 18, a first voltage is provided to a selected word line (e.g., a first word line) connected with a first memory cell to be programmed, and a second voltage is provided to a first non-selected word line (e.g., a second word line) connected with a second memory cell not to be programmed. The second memory cell may be disposed between the first memory cell and a ground selection line. A don't care condition may be applied to a level rising time of a third voltage that is provided to a second non-selected word line that is connected with a memory cell (e.g., a third memory cell) disposed between the first memory cell and a bit line.

First, a level of the first voltage rises during a predetermined period (block S11), and according to a rising result, the first voltage reaches a first level (block S12). Until the first voltage reaches the first level, a second voltage does not rise.

Afterward, a level of the second voltage to be provided to the first non-selected word line (e.g., the second word line) rises during a predetermined period (block S13), and according to a rising result, the second voltage reaches the first level (block S14). Since the level of the second voltage rises after the first memory cell is turned on, a boosting degree with respect to the second memory cell (or the second word line) may be decreased, and an increase in the threshold voltage of the first memory cell due to HCI may be decreased. Afterward, the first voltage rises to a program voltage level for a program block (block S15).

As illustrated in FIG. 19, a first voltage may be provided to a selected word line (e.g., a first word line) connected with a first memory cell to be programmed, and may maintain a third level (block S21). The third level may have a value between a ground voltage and a first level, e.g., may have an intermediate value between the ground voltage and the first level.

Afterward, a level of a second voltage to be provided to the first non-selected word line (e.g., the second word line) rises during a predetermined period (block S22), and according to a rising result, the second voltage reaches the first level (block S23). Although the second voltage reaches the first level, the first memory cell is turned on due to a third-level voltage applied to the first word line, and thus a boosting degree with respect to a second memory cell (or the second word line) may be decreased. Afterward, in order to increase a boosting degree with respect to a non-selected cell string, a level of the first voltage may transition to a ground voltage level (block S24). Afterward, when the level of the first voltage rises, the first voltage may reach the first level (block S25), and also, for a program operation, the first voltage rises to a program voltage (block S26).

Figure 20:
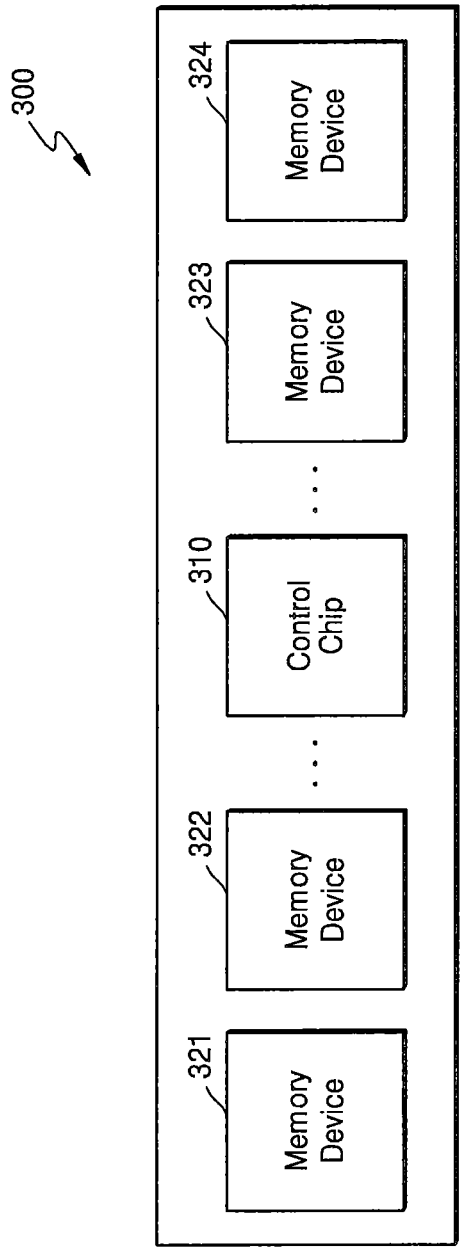
FIG. 20 is a block diagram of a memory module according to some embodiments of the inventive concepts.

FIG. 20 is a block diagram of a memory module 300 according to some embodiments of the inventive concepts. Referring to FIG. 20, the memory module 300 may include memory devices 321 through 324 and a control chip 310. The memory devices 321 through 324 may store data. For example, one or more of the memory devices 321 through 324 may be the memory device 200 of FIG. 1. The control chip 310 may control the memory devices 321 through 324, in response to various control signals transmitted by an external memory controller, such as the memory controller 100 of FIG. 1. For example, the control chip 310 may activate one of the memory devices 321 through 324, which corresponds to a chip selection signal transmitted from an external source, and may perform an error checking and correcting operation on data read from each of the memory devices 321 through 324.

When a program operation is performed on the memory devices 321 through 324, as in the aforementioned previous embodiments, a control of the voltage level rising time may be performed. The control of the voltage level rising time is performed by the control chip 310, and timing-controlled voltages (e.g., first through third voltages) may be provided to each of the memory devices 321 through 324.

Figure 21:
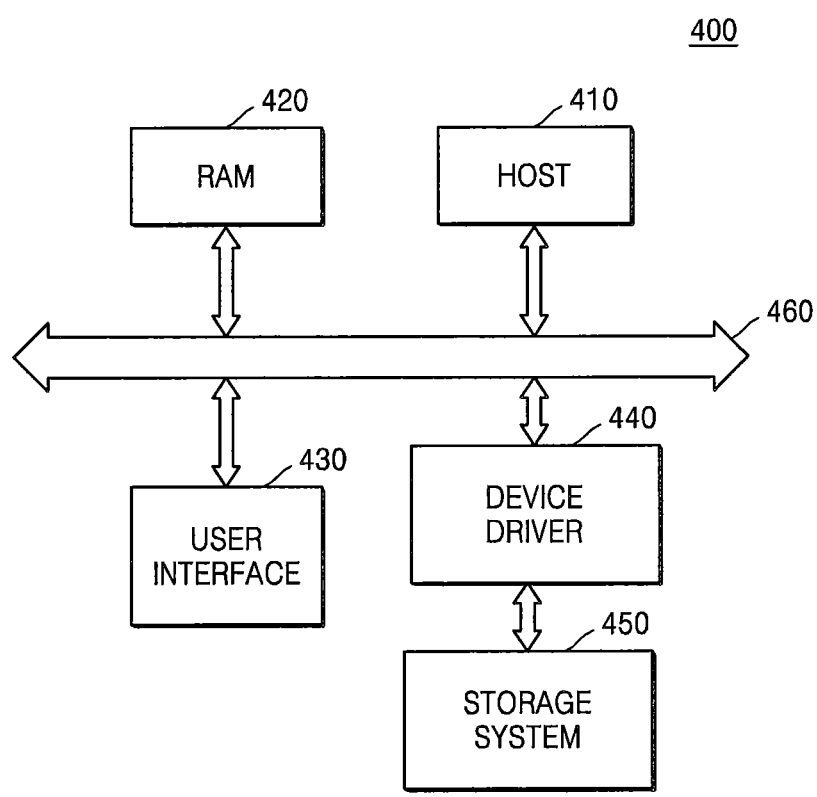
FIG. 21 is a block diagram of a computing system including a non-volatile storage system, according to some embodiments of the inventive concepts.

FIG. 21 is a block diagram of a computing system 400 including a non-volatile storage system 450, according to some embodiments of the inventive concepts. The computing system 400 may be a mobile device or a desktop computer. The computing system 400 may include a host 410 including a central processing unit (CPU), or the like, random access memory (RAM) 420, a user interface 430, and a device driver 440 that are electrically connected to a bus 460. The non-volatile storage system 450 may be connected with the device driver 440. The host 410 may overall control the computing system 400 and may perform a calculation that corresponds to a user's command input via the user interface 430. The RAM 420 may function as a data memory of the host 410, and the host 410 may write or read user data to or from the non-volatile storage system 450 via the device driver 440. In the example of FIG. 21, the device driver 440 for controlling operations and management of the non-volatile storage system 450 is arranged outside the host 410, but the device driver 440 may be arranged in the host 410. The non-volatile storage system 450 may include the memory device 200 of FIG. 1.

Figure 22:
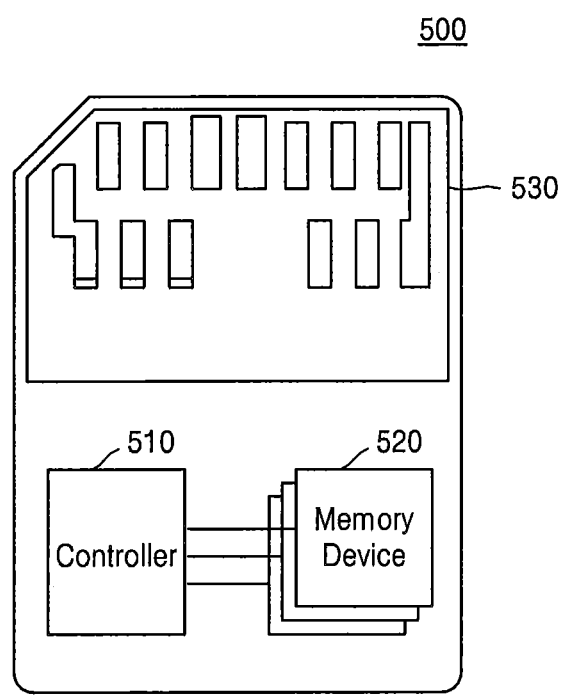
FIG. 22 illustrates a memory card according to some embodiments of the inventive concepts.

FIG. 22 illustrates a memory card 500 according to some embodiments of the inventive concepts. The memory card 500 may be a portable storage device that may be used after being connected with an electronic device such as a mobile device, a desktop computer, or the like. As shown in FIG. 22, the memory card 500 may include a memory controller 510, a memory device 520, and a port region 530. The memory card 500 may communicate with an external host via the port region 530, and the memory controller 510 may control the memory device 520. The memory controller 510 may read a program from read-only memory (ROM) that stores the program and thus may execute the program. In the present embodiment, the memory controller 510 may provide various types of information for a voltage level control and/or a voltage rising time control to the memory device 520, and the memory device 520 may adjust rising times of voltages that are provided to a word line, based on the received information.

Figure 23:
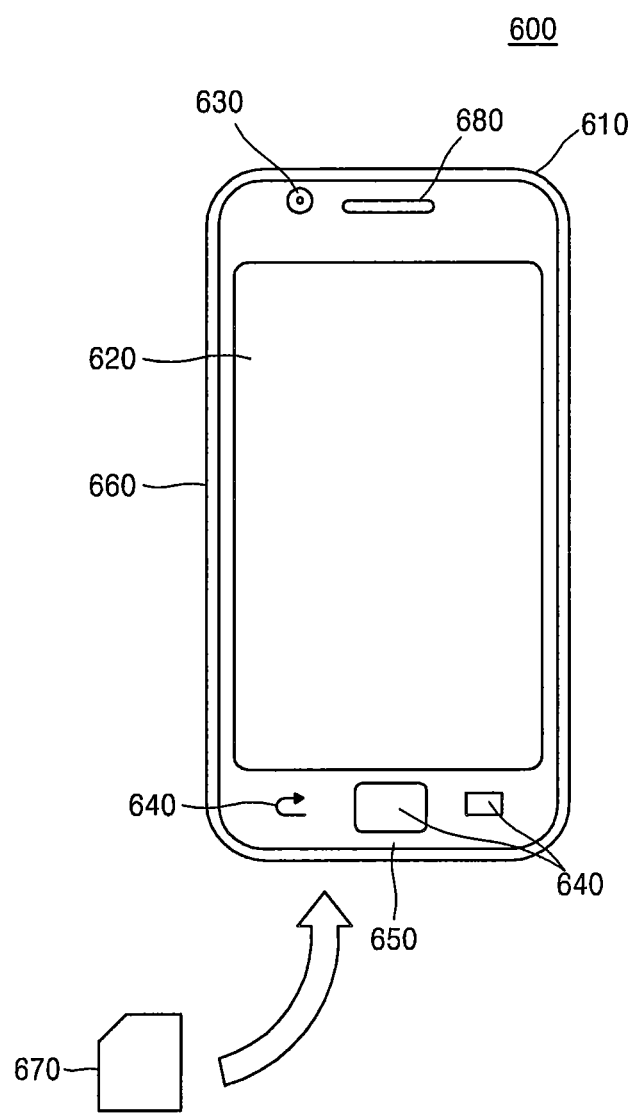
FIG. 23 illustrates a mobile terminal having a memory system, according to some embodiments of the inventive concepts.

FIG. 23 illustrates a mobile terminal 600 having a memory system, according to some embodiments of the inventive concepts. The memory system according to the one or more embodiments of the inventive concepts may be equipped in the mobile terminal 600 of FIG. 23. The mobile terminal 600 may be a smartphone of which functions are not limited and most of the functions may be changed or extended via an application program. The mobile terminal 600 includes an embedded antenna 610 for exchanging a radio frequency (RF) signal with a wireless base station. The embedded antenna 610 includes a display screen 620 such as a liquid crystal display (LCD) screen, an organic light emitting diode (OLED) screen, or the like for displaying images captured by a camera 630 or images received and decoded by the embedded antenna 610. The mobile terminal 600 may include an operation panel 640 that includes a control button and a touch panel. When the display screen 620 is a touch screen, the operation panel 640 may further include a touch sensing panel of the display screen 620. The mobile terminal 600 may include a sound output unit in the form of a speaker 680 or other device for outputting voice and/or sound, and a sound input unit in the form of a microphone 650 or other device for receiving an input of voice and/or sound. The mobile terminal 600 may further include the camera 630 such as a charge-coupled device (CCD) camera for capturing a video and a still image. The mobile terminal 600 may be installed with a storage medium 670 for storing encoded or decoded data such as a video or still images captured by the camera 630, received via an e-mail, and/or obtained in another manner, and may include a slot 660 for mounting the storage medium 670 in the mobile terminal 600.

While the inventive concepts have been particularly shown and described with reference to exemplary embodiments thereof, it will be understood that various changes in form and details may be made therein without departing from the spirit and scope of the following claims.

What is claimed is:

1. An operating method of a non-volatile memory device, the operating method comprising:
   applying a first voltage to a first word line connected with a first cell to be programmed;
   applying a second voltage to a second word line connected with a second cell not to be programmed;
   applying a third voltage to a third word line connected with a third cell not to be programmed;

increasing a level of the first voltage and a level of the third voltage to a first level;

increasing and maintaining a level of the second voltage from a level different than the first level to a second level corresponding to a pass voltage after the level of the first voltage and the level of the third voltage rise to the first level; and then increasing the level of the first voltage from the first level to a program voltage level after the level of the second voltage rises to the second level, wherein the second cell is between the first cell and a ground selection transistor, wherein the third cell is between the first cell and a string selection transistor, and wherein a transition of the level of the second voltage is controlled independently from a transition of the level of the third voltage.

2. The operating method of claim 1, wherein the non-volatile memory device comprises a memory cell array having three-dimensional (3D) NAND (VNAND) memory cells.

3. The operating method of claim 1, wherein, after the level of the second voltage rises to the first level, the level of the first voltage rises to the program voltage level.

4. The operating method of claim 1, wherein the first cell and the second cell are connected between the bit line and the ground selection line, wherein the first cell is adjacent to the bit line, and wherein the second cell is adjacent to the ground selection line.

5. The operating method of claim 1, further comprising, before increasing the level of the first voltage to the first level, maintaining the level of the first voltage at a third level having a value between a ground voltage and the first level.

6. The operating method of claim 5, further comprising:
transitioning the level of the first voltage from the third level to the ground voltage level,
wherein the level of the first voltage rises from the ground voltage level to the first level.

7. The operating method of claim 1, further comprising:
maintaining the level of the second voltage at a third level having a value between a ground voltage level and the first level, and
wherein, after the level of the first voltage rises to the first level, the level of the second voltage rises from the third level to the first level.

8. The operating method of claim 1, wherein the level of the second voltage rises after the first cell is turned on such that a variation of a threshold voltage of the first cell due to hot carrier injection (HCI) is decreased.

9. The method of claim 1, wherein a time of the transition of the level of the second voltage is different from a time of the transition of the level of the third voltage.

10. A method of operating a non-volatile memory device, the method comprising:
in a programming operation, applying a first voltage and a second voltage to a selected memory cell for programming and a first non-selected memory cell, respectively, and in the programming operation, applying a third voltage to a second non-selected memory cell, wherein, before a level of the second voltage and a level of the third voltage rise to a predetermined voltage level that is less than a program voltage level but is sufficient to turn on the first and the second non-selected memory cells, a level of the second voltage is maintained at an intermediate voltage level greater than a ground level while the level of the first voltage and the level of the third voltage are maintained at the ground level, wherein, after the first, second, and third voltages are maintained for a predetermined time, the levels of the first and third voltages simultaneously rise to the predetermined voltage level, wherein the level of the first voltage is increased from the predetermined voltage level to a program voltage level after the level of the first, second, and third voltages rise to the predetermined voltage level, and wherein the first non-selected memory cell is between the selected memory cell and a ground selection transistor, wherein the second non-selected memory cell is between the selected memory cell and a string selection transistor.

11. The method of claim 10, wherein the level of the first voltage rises to the predetermined voltage level before the level of the second voltage rises to the predetermined voltage level.

12. The method of claim 10, wherein the level of the first voltage is maintained at an intermediate voltage level less than the predetermined voltage level but sufficient to turn on the selected memory cell before the level of the second voltage rises to the predetermined voltage level.

13. The method of claim 10, wherein, before the level of the second voltage rises to the predetermined voltage level, the level of the second voltage is maintained at the intermediate voltage level that is less than the predetermined voltage level such that a rise time for the second voltage defines a step function.

14. The method of claim 13, wherein the intermediate voltage level is greater than the ground level but is insufficient to turn on the first non-selected memory cell.

15. The method of claim 10,
wherein the level of the third voltage rises to the predetermined voltage level before or after the level of the second voltage rises to the predetermined voltage level.

16. The method of claim 10, wherein, during the programming operation for the selected memory cell, the level of the first voltage rises to the predetermined voltage level after the level of the second voltage rises to the predetermined voltage level and before the first voltage rises to the program voltage level.

17. The method of claim 16, wherein, after the level of the second voltage rises to the predetermined voltage level and before the level of the first voltage rises to the predetermined voltage level, the level of the first voltage is decreased to the ground voltage level.

18. The method of claim 10, wherein a time of a transition of the level of the second voltage is different from a time of a transition of the level of the third voltage.

* * * * *